US011219952B2

(12) United States Patent
Ono et al.

(10) Patent No.: US 11,219,952 B2
(45) Date of Patent: Jan. 11, 2022

(54) SURFACE-COATED CUTTING TOOL AND METHOD OF MANUFACTURING THE SAME

(71) Applicant: SUMITOMO ELECTRIC HARDMETAL CORP., Itami (JP)

(72) Inventors: Satoshi Ono, Itami (JP); Shinya Imamura, Itami (JP); Susumu Okuno, Itami (JP); Anongsack Paseuth, Itami (JP)

(73) Assignee: Sumitomo Electric Hardmetal Corp., Itami (JP)

( * ) Notice: Subject to any disclaimer, the term of this patent is extended or adjusted under 35 U.S.C. 154(b) by 248 days.

(21) Appl. No.: 16/466,227

(22) PCT Filed: Dec. 14, 2018

(86) PCT No.: PCT/JP2018/046163
§ 371 (c)(1),
(2) Date: Jun. 3, 2019

(87) PCT Pub. No.: WO2019/176202
PCT Pub. Date: Sep. 19, 2019

(65) Prior Publication Data
US 2020/0361002 A1 Nov. 19, 2020

(30) Foreign Application Priority Data
Mar. 16, 2018 (JP) .............................. JP2018-049285

(51) Int. Cl.
B23B 27/14 (2006.01)
B24C 1/10 (2006.01)
(Continued)

(52) U.S. Cl.
CPC .............. *B23B 27/148* (2013.01); *B24C 1/10* (2013.01); *C23C 16/04* (2013.01); *C23C 16/36* (2013.01);
(Continued)

(58) Field of Classification Search
CPC . B23B 27/14; B23B 27/148; B23B 2228/105; C23C 16/36; C23C 16/403; C23C 16/56
(Continued)

(56) References Cited

U.S. PATENT DOCUMENTS 5,374,471 A   12/1994  Yoshimura et al.
7,985,471 B2  7/2011   Zackrisson et al.
(Continued)

FOREIGN PATENT DOCUMENTS

EP   1772217 B1   4/2013
EP   3199277 A1   8/2017
(Continued)

OTHER PUBLICATIONS

U.S. Appl. No. 16/465,852, filed May 31, 2019.
(Continued)

*Primary Examiner* — Archene A Turner
(74) *Attorney, Agent, or Firm* — Baker Botts L.L.P.; Michael A. Sartori

(57) ABSTRACT

A surface-coated cutting tool includes a base material and a coating covering the base material. The base material includes a rake face and a flank face. The coating includes a TiCN layer. The TiCN layer has a (422) orientation in a region d1 in the rake face. The TiCN layer has a (311) orientation in a region d2 in the flank face.

11 Claims, 5 Drawing Sheets

(51) Int. Cl.
*C23C 16/04* (2006.01)
*C23C 16/36* (2006.01)

(52) U.S. Cl.
CPC ....... *B23B 2222/28* (2013.01); *B23B 2224/04* (2013.01); *B23B 2224/32* (2013.01); *B23B 2228/04* (2013.01); *B23B 2228/105* (2013.01); *B23B 2228/36* (2013.01)

(58) Field of Classification Search
USPC .......... 407/119; 51/307, 309; 428/336, 698, 428/701, 702
See application file for complete search history.

(56) References Cited

U.S. PATENT DOCUMENTS

| 9,463,513 | B2 | 10/2016 | Oestlund et al. | |
|---|---|---|---|---|
| 2006/0019120 | A1* | 1/2006 | Jonsson | C23C 30/005 |
| | | | | 428/701 |
| 2006/0222885 | A1* | 10/2006 | Fukano | C23C 30/005 |
| | | | | 428/689 |
| 2008/0057280 | A1* | 3/2008 | Watanabe | C23C 16/36 |
| | | | | 428/216 |
| 2010/0232893 | A1* | 9/2010 | Imamura | C23C 28/042 |
| | | | | 407/119 |
| 2012/0225247 | A1* | 9/2012 | Sone | C23C 28/044 |
| | | | | 428/141 |
| 2012/0275870 | A1* | 11/2012 | Paseuth | C23C 16/36 |
| | | | | 407/119 |
| 2014/0308083 | A1* | 10/2014 | Bjormander | B23C 5/16 |
| | | | | 407/119 |

FOREIGN PATENT DOCUMENTS

| JP | H06-158325 | A | 6/1994 |
|---|---|---|---|
| JP | 07-062542 | * | 3/1995 |
| JP | H11-124672 | A | 5/1999 |
| JP | 2006-305714 | A | 11/2006 |
| JP | 2015-500148 | A | 1/2015 |
| WO | 2011/055813 | A1 | 5/2011 |
| WO | 2013/087848 | A1 | 6/2013 |

OTHER PUBLICATIONS

Office Action issued in U.S. Appl. No. 16/465,852 dated Apr. 29, 2021.

Notice of Allowance issued in U.S. Appl. No. 16/465,852 dated Sep. 3, 2021.

* cited by examiner

SURFACE-COATED CUTTING TOOL AND METHOD OF MANUFACTURING THE SAME

TECHNICAL FIELD

The present disclosure relates to a surface-coated cutting tool and a method of manufacturing the same. The present application claims the priority of Japanese Patent Application No. 2018-049285 filed on Mar. 16, 2018, the entire contents of which are hereby incorporated by reference.

BACKGROUND ART

Various studies have conventionally been conducted to increase the life of a cutting tool. For example, Japanese Patent Laying-Open No. 06-158325 (PTL 1) and Japanese Patent Laying-Open No. 11-124672 (PTL 2) each disclose a cutting tool including a base material and a coating formed on a surface of the base material.

CITATION LIST

Patent Literature

PTL 1: Japanese Patent Laying-Open No. 06-158325
PTL 2: Japanese Patent Laying-Open No. 11-124672

SUMMARY OF INVENTION

A surface-coated cutting tool according to the present disclosure is a surface-coated cutting tool including a base material and a coating covering the base material, wherein
the base material includes a rake face and a flank face,
the coating includes a TiCN layer,
the TiCN layer has a (422) orientation in a region d1 in the rake face,
the TiCN layer has a (311) orientation in a region d2 in the flank face,
when the rake face and the flank face are continuous with each other with a cutting edge face therebetween,
the region d1 is a region sandwiched between an imaginary line D1 and a boundary between the rake face and the cutting edge face, the imaginary line D1 being 500 µm apart from an imaginary ridge line on the rake face, the imaginary ridge line being an intersection between a surface obtained by extending the rake face and a surface obtained by extending the flank face, and
the region d2 is a region sandwiched between an imaginary line D2 and a boundary between the flank face and the cutting edge face, the imaginary line D2 being 500 µm apart from the imaginary ridge line on the flank face, and
when the rake face and the flank face are continuous with each other with a ridge line therebetween,
the region d1 is a region sandwiched between the ridge line and an imaginary line D1 which is 500 µm apart from the ridge line on the rake face, and
the region d2 is a region sandwiched between the ridge line and an imaginary line D2 which is 500 µm apart from the ridge line on the flank face.
A method of manufacturing a surface-coated cutting tool according to the present disclosure is a method of manufacturing the surface-coated cutting tool described above, the method including:
a base material preparation step of preparing the base material;
a TiCN layer covering step of covering at least part of the rake face and at least part of the flank face with the TiCN layer; and
a peening step of peening the TiCN layer in the flank face,
wherein the TiCN layer covering step is performed by chemical vapor deposition and includes discontinuously supplying a source gas of the TiCN layer.

DETAILED DESCRIPTION

Figure 1:
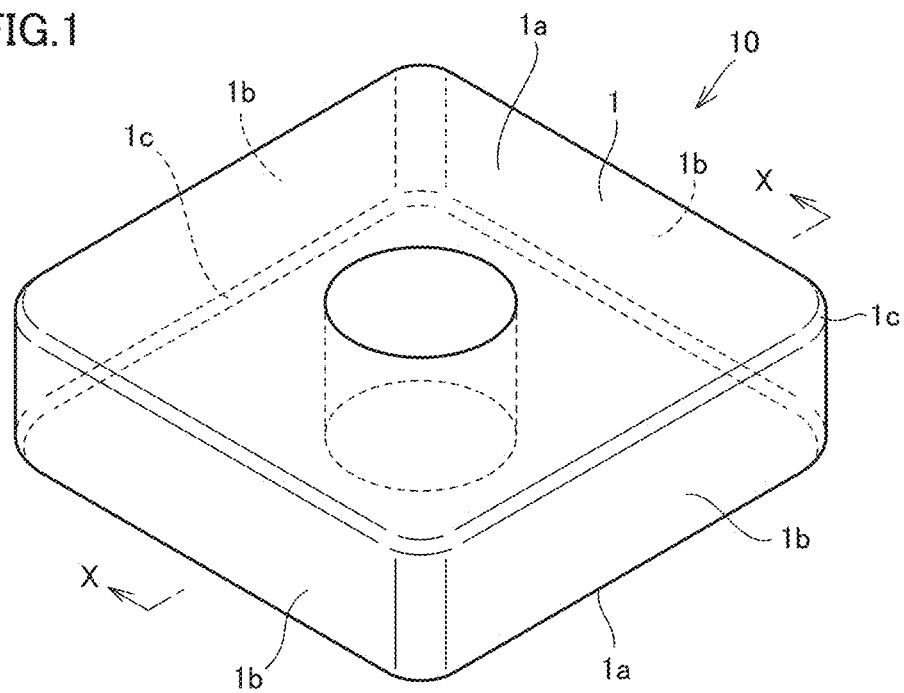
FIG. 1 is a perspective view illustrating an aspect of a cutting tool.

Problem to be Solved by the Present Disclosure

According to PTL 1 and PTL 2, the performance (e.g., chipping resistance or wear resistance) of a cutting tool is improved by providing a hard coating on a surface of a base material. Although a rake face and a flank face of the cutting tool are desired to have different performance, the rake face and the flank face are provided with coatings of the same quality in the cutting tools described in PTL 1 and PTL 2. As a result, even if the performance of, for example, the rake face is improved by the provision of the coating, the performance of the flank face may be insufficient. Under such circumstances, the cutting tool having a coating provided on its surface is desired to be improved further.
The present disclosure has been made in view of the above circumstances, and has an object to provide a surface-coated cutting tool having excellent chipping resistance and also having excellent crater wear resistance in high-speed machining, and a method of manufacturing the same.

Advantageous Effect of the Present Disclosure

According to the above, a surface-coated cutting tool having excellent chipping resistance and also having excellent crater wear resistance in high-speed machining, and a method of manufacturing the same can be provided.

Description of Embodiments

First, the present disclosure is described based on aspects listed below.
[1] A surface-coated cutting tool according to an aspect of the present disclosure is a surface-coated cutting tool including a base material and a coating covering the base material, wherein
the base material includes a rake face and a flank face,
the coating includes a TiCN layer, the TiCN layer has a (422) orientation in a region d1 in the rake face, the TiCN layer has a (311) orientation in a region d2 in the flank face, when the rake face and the flank face are continuous with each other with a cutting edge face therebetween, the region d1 is a region sandwiched between an imaginary line D1 and a boundary between the rake face and the cutting edge face, the imaginary line D1 being 500 μm apart from an imaginary ridge line on the rake face, the imaginary ridge line being an intersection between a surface obtained by extending the rake face and a surface obtained by extending the flank face, and the region d2 is a region sandwiched between an imaginary line D2 and a boundary between the flank face and the cutting edge face, the imaginary line D2 being 500 μm apart from the imaginary ridge line on the flank face, and when the rake face and the flank face are continuous with each other with a ridge line therebetween, the region d1 is a region sandwiched between the ridge line and an imaginary line D1 which is 500 μm apart from the ridge line on the rake face, and the region d2 is a region sandwiched between the ridge line and an imaginary line D2 which is 500 μm apart from the ridge line on the flank face.

The surface-coated cutting tool having the above features can have both of a flank face with excellent toughness and a rake face with excellent hardness. The surface-coated cutting tool accordingly has excellent chipping resistance and also has excellent crater wear resistance in high-speed machining. Herein, "crater wear" means a wear in the rake face.

[2] The TiCN layer having a (311) orientation means that, among texture coefficients TC (hkl) defined by equation (1) below, a texture coefficient TC (311) of a (311) plane in the TiCN layer is greater than a texture coefficient of any other crystal orientation plane, and the TiCN layer having a (422) orientation means that, among the texture coefficients TC (hkl) defined by equation (1) below, a texture coefficient TC (422) of a (422) plane in the TiCN layer is greater than a texture coefficient of any other crystal orientation plane,

[Math 1]

$$TC(hkl) = \frac{I(hkl)}{I_0(hkl)} \left\{ \frac{1}{8} \sum_{x,y,z} \frac{I(h_x k_y l_z)}{I_0(h_x k_y l_z)} \right\}^{-1} \quad (1)$$

where $I(hkl)$ and $I(h_x k_y l_z)$ represent a measured diffraction intensity of a (hkl) plane and a measured diffraction intensity of a $(h_x k_y l_z)$ plane, respectively, $I_o(hkl)$ and $I_o(h_x k_y l_z)$ represent an average value of powder diffraction intensities of TiC and TiN of a (hkl) plane according to a JCPDS database and an average value of powder diffraction intensities of TiC and TiN of a $(h_x k_y l_z)$ plane according to the JCPDS database, respectively, and (hkl) and $(h_x k_y l_z)$ each represent any one of eight planes including a (111) plane, a (200) plane, a (220) plane, a (311) plane, a (331) plane, a (420) plane, a (422) plane, and a (511) plane.

[3] A ratio $TC_{flank}$ (311)/$TC_{flank}$ (422) of a (311) texture coefficient to a (422) texture coefficient in the region d2 of the flank face is greater than 1. The ratio thus defined results in a surface-coated cutting tool with more excellent chipping resistance.

[4] A ratio $TC_{flank}$ (422)/$TC_{rake}$ (422) of a (422) texture coefficient in the region d2 of the flank face to a (422) texture coefficient in the region d1 of the rake face is not greater than 1. The ratio thus defined results in a surface-coated cutting tool with more excellent crater wear resistance in high-speed machining.

[5] The TiCN layer has a thickness of not less than 6 μm and not greater than 10 μm. The TiCN layer thus defined results in a surface-coated cutting tool with excellent wear resistance and excellent chipping resistance.

[6] The base material includes one selected from the group consisting of cemented carbide, cermet, high-speed steel, ceramic, cBN sintered body, and diamond sintered body. The base material thus defined results in a surface-coated cutting tool with excellent hardness and excellent strength at high temperatures.

[7] When the base material is cemented carbide, the base material contains cobalt in an amount of not less than 7 mass % and not greater than 12 mass % relative to a total mass of the base material. The base material thus defined results in a surface-coated cutting tool with excellent wear resistance and excellent chipping resistance.

[8] The coating further includes an $Al_2O_3$ layer formed on the TiCN layer. The coating thus defined results in a surface-coated cutting tool with excellent heat resistance and excellent chemical stability.

[9] The $Al_2O_3$ layer has a thickness of not less than 0.5 μm and not greater than 4 μm. The $Al_2O_3$ layer thus defined results in a surface-coated cutting tool with more excellent heat resistance and more excellent chemical stability.

[10] A method of manufacturing a surface-coated cutting tool according to the present disclosure is a method of manufacturing the surface-coated cutting tool according to any one of [1] to [7] above, the method including:

a base material preparation step of preparing the base material;

a TiCN layer covering step of covering at least part of the rake face and at least part of the flank face with the TiCN layer; and a peening step of peening the TiCN layer in the flank face, wherein the TiCN layer covering step is performed by chemical vapor deposition and includes discontinuously supplying a source gas of the TiCN layer.

The method includes the steps as described above, thus manufacturing a surface-coated cutting tool having excellent chipping resistance and also having excellent crater wear resistance in high-speed machining.

[11] The coating further includes an $Al_2O_3$ layer formed on the TiCN layer, and the method further includes an $Al_2O_3$ layer stacking step of stacking the $Al_2O_3$ layer on the TiCN layer after the TiCN layer covering step or the peening step. The method thus defined can manufacture a surface-coated cutting tool having excellent thermal resistance and excellent chemical stability.

Details of Embodiments of the Present Disclosure

Hereinbelow, an embodiment of the present disclosure (hereinbelow referred to as "the present embodiment") will be described. However, the present embodiment is not limited thereto. In the drawings used for the following description of the embodiment, the same reference characters denote the same parts or corresponding parts. In the present specification, an equation in the form of "A to B"

means a range's upper and lower limits (that is, not less than A and not greater than B), and when A is not accompanied by any unit and B alone is accompanied by a unit, A has the same unit as B. Further, in the present specification, when a compound is represented by a composition formula (chemical formula) with its constituent element ratio unspecified, such as "TiC," the composition formula (or chemical formula) shall encompass any conventionally known composition (element ratio). The composition formula (chemical formula) shall include not only a stoichiometric composition but also a nonstoichiometric composition. For example, the composition formula (chemical formula) of "TiC" includes not only a stoichiometric composition "$Ti_1C_1$" but also a nonstoichiometric composition, for example, "$Ti_1C_{0.8}$." Compounds other than "TiC" are also similarly described.

<<Surface-Coated Cutting Tool>>

A surface-coated cutting tool according to the present embodiment is a surface-coated cutting tool including a base material and a coating covering the base material, wherein the base material includes a rake face and a flank face, the coating includes a TiCN layer, the TiCN layer has a (422) orientation in a region d1 in the rake face, the TiCN layer has a (311) orientation in a region d2 in the flank face, when the rake face and the flank face are continuous with each other with a cutting edge face therebetween, the region d1 is a region sandwiched between an imaginary line D1 and a boundary between the rake face and the cutting edge face, the imaginary line D1 being 500 μm apart from an imaginary ridge line on the rake face, the imaginary ridge line being an intersection between a surface obtained by extending the rake face and a surface obtained by extending the flank face, and the region d2 is a region sandwiched between an imaginary line D2 and a boundary between the flank face and the cutting edge face, the imaginary line D2 being 500 μm apart from the imaginary ridge line on the flank face, and when the rake face and the flank face are continuous with each other with a ridge line therebetween, the region d1 is a region sandwiched between the ridge line and a imaginary line D1 which is 500 μm apart from the ridge line on the rake face, and the region d2 is a region sandwiched between the ridge line and a imaginary line D2 which is 500 μm apart from the ridge line on the flank face.

The surface-coated cutting tool of the present embodiment includes a base material and a coating that covers the base material (hereinbelow, also merely referred to as a "cutting tool"). The cutting tool can be, for example, a drill, an end mill, an indexable insert for drill, an indexable insert for end mill, an indexable insert for milling, an indexable insert for turning, a metal-slitting saw, a gear-cutting tool, a reamer, or a tap.

<Base Material>

The base material of the present embodiment may be any conventionally known base material of this type. For example, the base material preferably includes one selected from the group consisting of cemented carbide (e.g., tungsten carbide (WC)-based cemented carbide, cemented carbide containing Co in addition to WC, cemented carbide containing WC and additionally containing carbonitride of Cr, Ti, Ta, Nb, or the like), cermet (mainly containing TiC, TiN, TiCN, or the like), high-speed steel, ceramic (e.g., titanium carbide, silicon carbide, silicon nitride, aluminium nitride, or aluminium oxide), cubic boron nitride sintered body (cBN sintered body), and diamond sintered body, and more preferably includes one selected from the group consisting of cemented carbide, cermet, and cBN sintered body.

In particular, WC-based cemented carbide or cermet (in particular, TiCN-based cermet) is preferably selected among these types of base materials. This is because these base materials particularly have an excellent balance between hardness and strength at high temperatures and have excellent characteristics as a base material of the surface-coated cutting tool for the above application purpose.

When the base material is cemented carbide, the base material preferably contains cobalt in an amount of not less than 7 mass % and not greater than 12 mass %, more preferably contains cobalt in an amount of not less than 8 mass % and not greater than 11 mass %, and still more preferably contains cobalt in an amount of not less than 9 mass % and not greater than 10.5 mass % relative to a total mass of the base material. The content ratio of cobalt can be determined by, for example, titration.

The base material has a rake face and a flank face. The "rake face" means a face that rakes chips chipped from a workpiece material. The "flank face" means a face, part of which is in contact with the workpiece material. Base materials are categorized into the following two cases: a "case in which the rake face and the flank face are continuous with each other with a cutting edge face therebetween," and a "case in which the rake face and the flank face are continuous with each other with a ridge line therebetween." This will be described below with reference to FIGS. 1 to 6.

Figure 2:
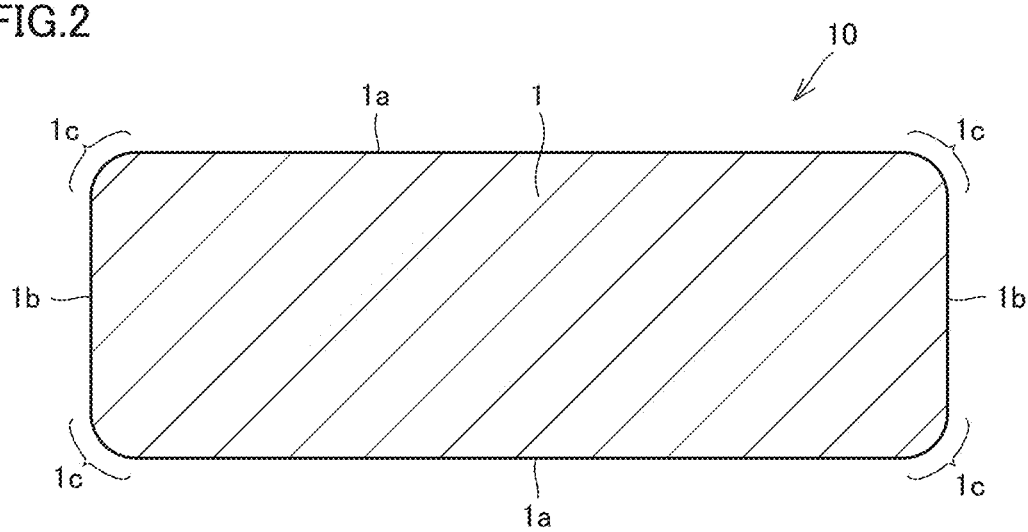
FIG. 2 is a sectional view taken along a line X-X in FIG. 1.

FIG. 1 is a perspective view illustrating an aspect of a cutting tool, and FIG. 2 is a sectional view taken along a line X-X in FIG. 1. The cutting tool having such a shape is used as an indexable insert for turning.

A cutting tool 10 shown in FIGS. 1 and 2 has surfaces including an upper surface, a lower surface, and four lateral surfaces, and has a shape of a quadrangular prism which has a somewhat low vertical profile in its entirety. Cutting tool 10 also has a through hole passing through its upper and lower surfaces, and the adjacent lateral surfaces are connected to each other by an arc face at each of boundaries of the four lateral surfaces.

In cutting tool 10, the upper surface and the lower surface form rake faces 1a, the four lateral surfaces (and the arc faces connecting these lateral surfaces to each other) form flank faces 1b, and the arc faces each connecting rake face 1a to flank face 1b form cutting edge faces 1c.

Figure 3:
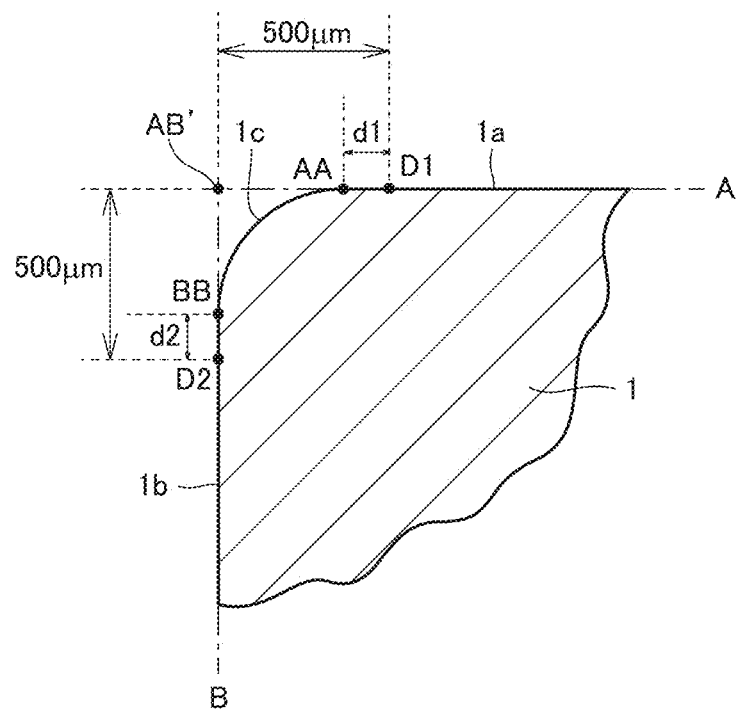
FIG. 3 is a partially enlarged view of FIG. 2.

FIG. 3 is a partially enlarged view of FIG. 2. FIG. 3 shows an imaginary plane A, a boundary AA, an imaginary plane B, a boundary BB, and an imaginary ridge line AB'.

Imaginary plane A corresponds to a face obtained by extending rake face 1a. Boundary AA is a boundary between rake face 1a and cutting edge face 1c. Imaginary plane B corresponds to a face obtained by extending flank face 1b. Boundary BB is a boundary between flank face 1b and cutting edge face 1c. Imaginary ridge line AB' is an intersection between the face (imaginary plane A) obtained by extending rake face 1a and the face (imaginary plane B) obtained by extending flank face 1b, and imaginary plane A and imaginary plane B intersect each other to define imaginary ridge line AB'.

In the case shown in FIG. 3, cutting edge face 1c is an arc face (horning). Rake face 1a and flank face 1b are continuous with each other with cutting edge face 1c therebetween, and cutting edge face 1c and portions of rake face 1a and flank face 1b, which are adjacent to cutting edge face 1c, form the cutting edge portion of cutting tool 10.

In FIG. 3, imaginary plane A and imaginary plane B are each shown in the form of a line, and boundary AA, boundary BB, and imaginary ridge line AB' are each shown in the form of a point.

Figure 4:
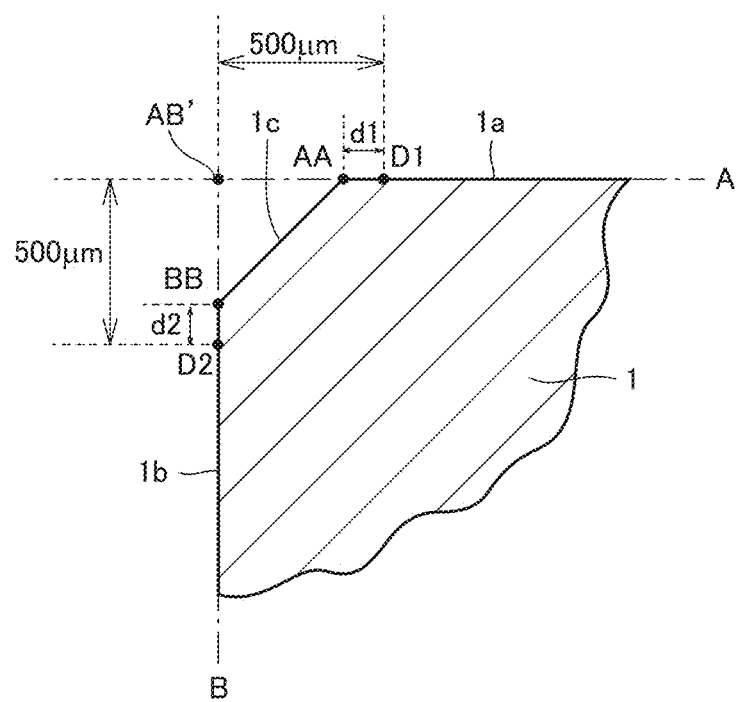
FIG. 4 illustrates another shape of a cutting edge portion.

Although FIGS. 1 to 3 show the case in which cutting edge face 1c is an arc face (horning), the shape of cutting edge face 1c is not limited thereto. For example, as shown in FIG. 4, cutting edge face 1c may have a plane shape (negative land). Alternatively, as shown in FIG. 5, cutting edge face 1c may have a shape (a shape combining horning and negative land) including both of a plane and an arc face.

Figure 5:
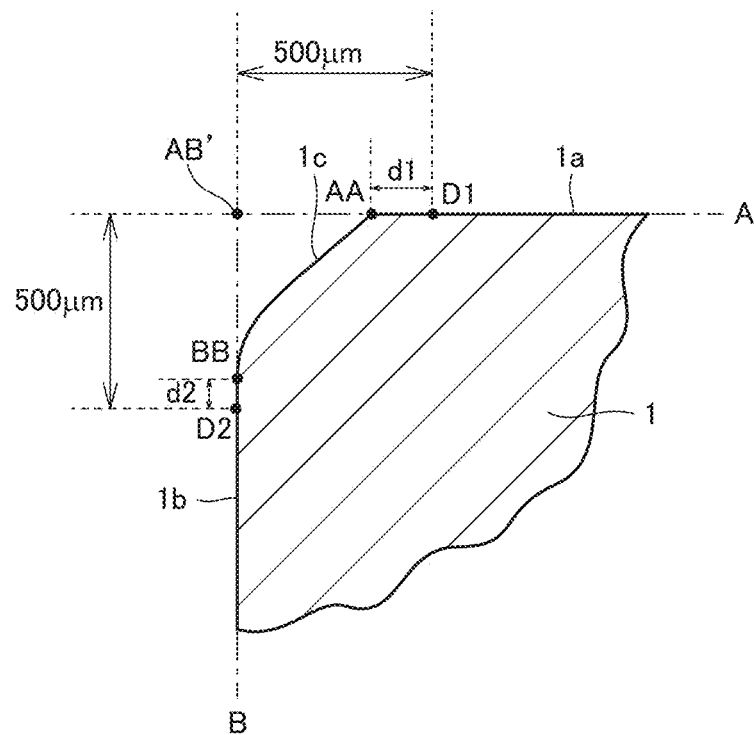
FIG. 5 illustrates still another shape of the cutting edge portion.

As in the case shown in FIG. 3, also in the cases shown in FIGS. 4 and 5, rake face 1a and flank face 1b are continuous with each other with cutting edge face 1c therebetween, and imaginary plane A, boundary AA, imaginary plane B, boundary BB, and imaginary ridge line AB' are defined.

In other words, all of the cases shown in FIGS. 3 to 5 are included in the "case in which the rake face and the flank face are continuous with each other with the cutting edge face therebetween."

In the cases in which base material 1 has the shapes as shown in FIGS. 3 to 5 as described above, cutting edge face 1c can be determined from its shape alone. This is because cutting edge face 1c in this case is not included in imaginary plane A or imaginary plane B, and accordingly can be visually differentiated from rake face 1a and flank face 1b.

Cutting edge face 1c is typically a surface of base material 1 and may include a face formed by mechanically machining the edges of intersecting faces. In other words, base material 1 is obtained by mechanically machining at least part of the surface of a base material precursor formed of, for example, a sintered body, and cutting edge face 1c may include a face formed by chamfering through mechanical machining.

Figure 6:
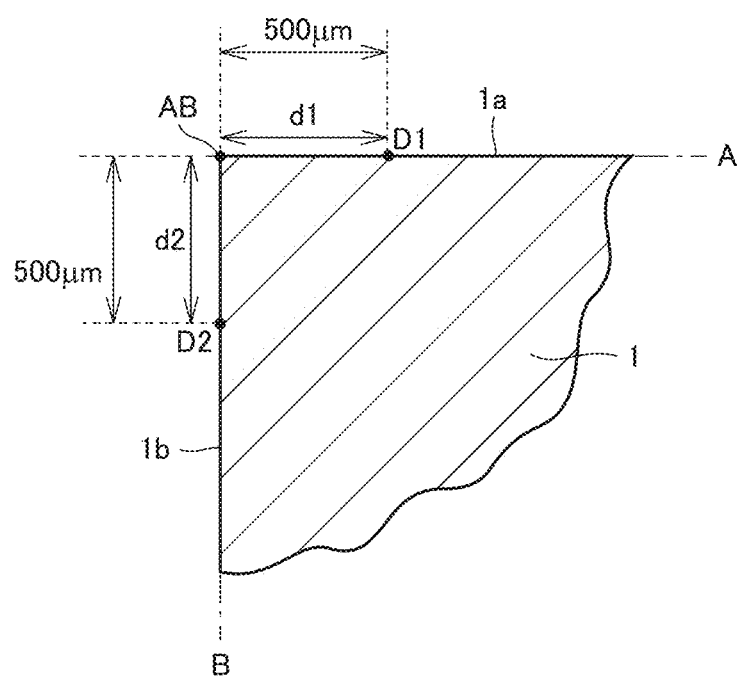
FIG. 6 illustrates still another shape of the cutting edge portion.

In contrast, the case in which base material 1 has a sharp edge shape as shown in FIG. 6 is included in the "case in which the rake face and the flank face are continuous with each other with a ridge line therebetween."

In the case shown in FIG. 6, there is no cutting edge face 1c shown in FIGS. 3 to 5, rake face 1a and flank face 1b are adjacent to each other, the boundary between rake face 1a and flank face 1b defines ridge line AB, and ridge line AB and portions of rake face 1a and flank face 1b, which are adjacent to ridge line AB, form the cutting edge portion of cutting tool 10.

Although the shape of and the names of the portions of base material 1 have been described with reference to FIGS. 1 to 6, the shape and the names of the portions which correspond to those of the above base material are used similarly for the surface-coated cutting tool according to the present embodiment. That is to say, the surface-coated cutting tool has a rake face and a flank face.

<Coating>

A "coating" according to the present embodiment means a film covering at least part of the rake face and at least part of the flank face in the base material. Even when the structure of the base material partially differs in part of the base material, it is within the scope of the present embodiment.

The thickness of the coating is preferably not less than 6.5 µm and not greater than 14 µm, and is more preferably not less than 8 µm and not greater than 11 µm. Herein, "the thickness of the coating" means a total of the thicknesses of layers constituting a coating, such as a TiCN layer, an Al$_2$O$_3$ layer, and any other layer described below. The thickness of the coating can be measured by, for example, measuring a cross section of the surface-coated cutting tool at a 1000-fold magnification using an optical microscope. Specifically, the thickness can be obtained by measuring any three points in the cross section and taking an average value of the thicknesses of the measured three points. The same holds true for the measurement of the respective thicknesses of the TiCN layer, the Al$_2$O$_3$ layer, and any other layer described below.

The coating includes a TiCN layer. The "TiCN layer" means a layer made of TiCN. The TiCN layer may contain inevitable impurities to such an extent that the effects achieved by the surface-coated cutting tool according to the present embodiment are not impaired. The same holds true for "any other layer" described below.

The thickness of the TiCN layer is preferably not less than 6 µm and not greater than 10 µm, and is more preferably not less than 7 µm and not greater than 9 µm. The thickness of the TiCN layer can be measured by, for example, measuring a cross section of the surface-coated cutting tool at a 1000-fold magnification using an optical microscope.

The coating may further include any other layer to such an extent that the effects of the present embodiment are not impaired. Examples of any other layer include a TiN layer, a TiBNO layer, a TiCNO layer, a TiB$_2$ layer, a TiAlN layer, a TiAlCN layer, a TiAlON layer, a TiAlONC layer, and an Al$_2$O$_3$ layer. Also, the order of stacking these layers is not particularly limited. That is to say, the TiCN layer may be an outermost layer in the coating.

In the coating according to the present embodiment, an Al$_2$O$_3$ layer may be provided on the TiCN layer. The description "an Al$_2$O$_3$ layer is provided on the TiCN layer" means that an Al$_2$O$_3$ layer is merely required to be provided over the TiCN layer, and does not require a contact between these layers. In other words, any other layer may be provided between the TiCN layer and the Al$_2$O$_3$ layer. Also, in the coating, an Al$_2$O$_3$ layer may be provided directly on the TiCN layer. The thickness of the Al$_2$O$_3$ layer is preferably not less than 0.5 µm and not greater than 4 µm, is more preferably not less than 0.5 µm and not greater than 3 µm, and is still more preferably not less than 1 µm and not greater than 2 µm. The thickness of the Al$_2$O$_3$ layer can be measured by, for example, measuring a cross section of the surface-coated cutting tool at a 1000-fold magnification using an optical microscope.

<Orientation of TiCN Layer in Region d1 of Rake Face>

In the surface-coated cutting tool according to the present embodiment, the TiCN layer has a (422) orientation in region d1 in rake face 1a.

In the "case in which rake face 1a and flank face 1b are continuous with each other with cutting edge face 1c therebetween" as shown in FIGS. 3 to 5, region d1 is a "region sandwiched between imaginary line D1, which is 500 µm apart from imaginary ridge line AB' on rake face 1a, and boundary AA between rake face 1a and cutting edge face 1c."

In contrast, in the "case in which rake face 1a and flank face 1b are continuous with each other with ridge line AB therebetween" as shown in FIG. 6, region d1 is a "region sandwiched between ridge line AB and imaginary line D1 which is 500 µm apart from ridge line AB on rake face 1a."

In the present embodiment, the TiCN layer may have a (422) orientation in a region which is in the rake face and is other than region d1, in addition to region d1. For example, the TiCN layer may have a (422) orientation in the entire rake face.

The description "TiCN layer has a (422) orientation" means that, among texture coefficients TC (hkl) defined by the following equation (1), a texture coefficient TC (422) of the (422) plane in the TiCN layer is greater than the texture coefficient of any other crystal orientation plane. In other words, it means that texture coefficient TC (422) is greatest among the texture coefficients of other crystal orientation planes. In the equation, I(hkl) and I($h_x k_y l_z$) represent a measured diffraction intensity of a (hkl) plane and a measured diffraction intensity of a ($h_x k_y l_z$) plane, respectively. $I_o$(hkl) represents an average value of a powder diffraction intensity of TiC (card No. 32-1383) in a (hkl) plane and a powder diffraction intensity of TiN (card No. 38-1420) in a (hkl) plane according to the Joint Committee on Powder Diffraction Standard database (JCPDS database). $I_o$($h_x k_y l_z$) represents an average value of a powder diffraction intensity of TiC (card No. 32-1383) in a ($h_x k_y l_z$) plane and a powder diffraction intensity of TiN (card No. 38-1420) in a ($h_x k_y l_z$) plane according to the JCPDS database. (hkl) and ($h_x k_y l_z$) each represent any one of eight planes including a (111) plane, a (200) plane, a (220) plane, a (311) plane, a (331) plane, a (420) plane, a (422) plane, and a (511) plane.

[Math 2]

$$TC(hkl) = \frac{I(hkl)}{I_0(hkl)} \left\{ \frac{1}{8} \sum_{x,y,z} \frac{I(h_x k_y l_z)}{I_0(h_x k_y l_z)} \right\}^{-1} \quad (1)$$

Figure 7:
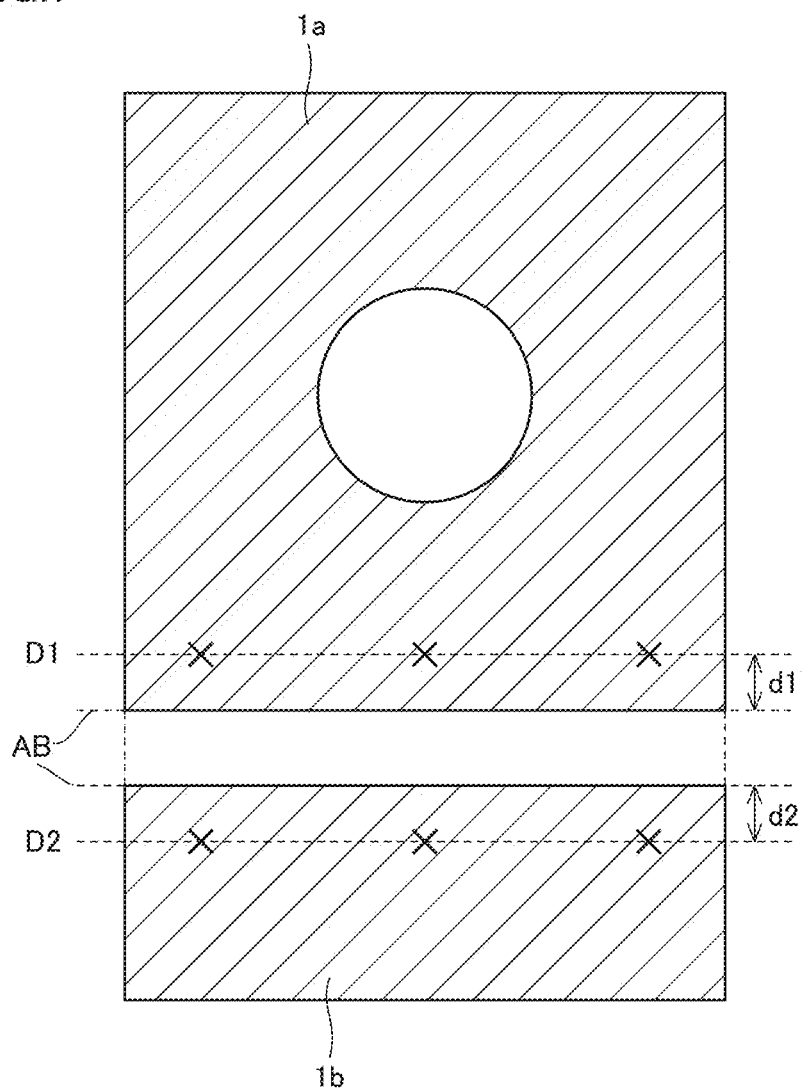
FIG. 7 is a schematic view illustrating positions of measurement of a rake face or a flank face in X-ray diffraction measurement.

Texture coefficient TC (hkl) can be obtained by, for example, X-ray diffraction measurement performed under the following conditions. Specifically, when base material 1 (i.e., cutting tool 10) has a sharp edge shape as shown in FIG. 6, any three points in region d1 sandwiched between ridge line AB and imaginary line D1 which is 500 μm apart from ridge line AB are subjected to X-ray diffraction measurement, and an average value of texture coefficients of a (hkl) plane obtained at these three points according to equation (1) above is taken as a texture coefficient TC (hkl) in region d1 of rake face 1a (FIG. 7). Although three points on imaginary line D1 are selected in FIG. 7 for any three points, any three points can be selected as long as they are located in region d1. In the cases in which base material 1 has the shapes as shown in FIGS. 3 to 5, any three points in region d1 sandwiched between boundary AA and imaginary line D1 are subjected to X-ray diffraction measurement, and an average value of the texture coefficients of the (hkl) plane obtained at these three points is taken as a texture coefficient TC (hkl) in region d1 of the rake face. Hereinbelow, the texture coefficient in region d1 of the rake face may be referred to as "$TC_{rake}$ (hkl)" or the like.

(Conditions of X-ray Diffraction Measurement)
X-ray output 45 kV, 200 mA
X-ray source, wavelength CuKα, 1.541862 Å
Detector D/teX Ultra 250
Axis of scan 2θ/θ
Longitudinal limiting slit width 2.0 mm
Scan mode CONTINUOUS
Scan speed 20°/min Herein, the diffraction intensity of X rays is calculated according to integrated intensity measurement.

The (422) texture coefficient in region d1 of the rake face is preferably not less than 3 and is more preferably not less than 4.

<Orientation of TiCN Layer in Region d2 of Flank Face>

In the surface-coated cutting tool according to the present embodiment, the TiCN layer has a (311) orientation in region d2 in flank face 1b.

Herein, in the "case in which rake face 1a and flank face 1b are continuous with each other with cutting edge face 1c therebetween" as shown in FIGS. 3 to 5, region d2 is a "region sandwiched between imaginary line D2, which is 500 μm apart from imaginary ridge line AB' on flank face 1b, and boundary BB between flank face 1b and cutting edge face 1c."

In contrast, in the "case in which rake face 1a and flank face 1b are continuous with each other with ridge line AB therebetween" as shown in FIG. 6, region d2 is a "region sandwiched between ridge line AB and imaginary line D2 which is 500 μm apart from ridge line AB on flank face 1b."

In the present embodiment, the TiCN layer may have a (311) orientation in a region which is in the flank surface and is other than region d2, in addition to region d2. For example, the TiCN layer may have a (311) orientation in the entire flank face.

The description "the TiCN layer has a (311) orientation" means that, among the texture coefficients TC (hkl) defined by equation (1) above, texture coefficient TC (311) of the (311) plane in the TiCN layer is greater than the texture coefficient of any other crystal orientation plane. In other words, it means that texture coefficient TC (311) is greatest among the texture coefficients of other crystal orientation planes. Texture coefficient TC (hkl) described above can be obtained by a method similar to a method described in <Orientation of TiCN Layer in Region d1 of Rake Face> above.

That is to say, in the "case in which rake face 1a and flank face 1b are continuous with each other with cutting edge face 1c therebetween" as shown in FIGS. 3 to 5, region d2 is a "region sandwiched between imaginary line D2, which is 500 μm apart from imaginary ridge line AB' on flank face 1b, and boundary BB between flank face 1b and cutting edge face c."

In contrast, in the "case in which rake face 1a and flank face 1b are continuous with each other with ridge line AB therebetween" as shown in FIG. 6, region d2 is a "region sandwiched between ridge line AB and imaginary line D2 which is 500 μm apart from ridge line AB on flank face 1b."

Hereinbelow, the texture coefficient in region d2 of the flank face may be referred to as "$TC_{flank}$(hkl)" or the like.

The (311) texture coefficient in region d2 of the flank face is preferably not less than 3 and is more preferably not less than 4.

In the present embodiment, a ratio $TC_{flank}$ (311)/$TC_{flank}$ (422) of the (311) texture coefficient to the (422) texture coefficient in region d2 of the flank face is preferably greater than 1, is more preferably not less than 1.2, and is still more preferably not less than 1.5. Herein, when $TC_{flank}$ (422) is zero and $TC_{flank}$ (311) is greater than zero, $TC_{flank}$ (311)/$TC_{flank}$ (422) is determined to be greater than 1. $TC_{flank}$ (311)/$TC_{flank}$ (422), which is greater than 1, achieves the effects according to the present embodiment.

In the present embodiment, ratio $TC_{flank}$ (422)/$TC_{rake}$ (422) of the (422) texture coefficient in region d2 of the flank face to the (422) texture coefficient in region d1 of the rake face is preferably not greater than 1, is more preferably not greater than 0.8, and is still more preferably not greater than 0.7. $TC_{flank}$ (422)/$TC_{rake}$ (422), which is not greater than 1, achieves the effects according to the present embodiment.

<<Method of Manufacturing Surface-Coated Cutting Tool>>

A method of manufacturing a surface-coated cutting tool according to the present embodiment is a method of manufacturing the above surface-coated cutting tool, the method including:

a base material preparation step of preparing the base material;

a TiCN layer covering step of covering at least part of the rake face and at least part of the flank face with the TiCN layer; and a peening step of peening the TiCN layer in the flank face, wherein the TiCN layer covering step is performed by chemical vapor deposition and includes discontinuously supplying a source gas of the TiCN layer. Each step will be described below.

<Base Material Preparation Step>

In the base material preparation step, the base material is prepared. The base material may be any base material which has been conventionally known as the base material of this type as described above. For example, when the base material is made of cemented carbide, first, raw material powder having a mix composition (mass %) shown in Table 1 described below is mixed uniformly using a commercially available attritor, and then, this powder mixture is compression-molded into a predetermined shape (e.g., CNMG120408NUX). Subsequently, a compact of the raw material powder is sintered at 1300° C. to 1500° C. or lower temperature for one to two hours in a predetermined sintering furnace, thereby obtaining the base material made of cemented carbide.

<TiCN Layer Covering Step>

In the TiCN layer covering step, at least part of the rake face and at least part of the flank face are covered with a TiCN layer.

Herein, "at least part of the rake face" is a region in rake face 1$a$ and includes region d1 sandwiched between ridge line AB, which is an intersection between rake face 1$a$ and flank face 1$b$, and imaginary line D1 which is 500 μm apart from ridge line AB (e.g., FIG. 6). Similarly, "at least part of the flank face" is a region in flank face 1$b$ and includes region d2 sandwiched between ridge line AB, which is an intersection between rake face 1$a$ and flank face 1$b$, and imaginary line D2 which is 500 μm apart from ridge line AB (e.g., FIG. 6).

In an aspect of the present embodiment, "at least part of the rake face" is a region in rake face 1$a$ and includes region d1 sandwiched between boundary AA between rake face 1$a$ and cutting edge face 1$c$ and imaginary line D1 which is 500 μm apart from imaginary ridge line AB' which is an intersection between imaginary plane A including rake face 1$a$ and imaginary plane B including flank face 1$b$ (e.g., FIGS. 3 to 5). Similarly, "at least part of the flank face" is a region in flank face 1$b$ and includes region d2 sandwiched between boundary BB between flank face 1$b$ and cutting edge face 1$c$ and imaginary line D2 which is 500 μm apart from imaginary ridge line AB' (e.g., FIGS. 3 to 5).

The method of covering at least part of the rake face and at least part of the flank face with the TiCN layer is performed by chemical vapor deposition (CVD), and includes discontinuously supplying a source gas of the TiCN layer to form the TiCN layer. That is to say, the TiCN layer covering step is performed by chemical vapor deposition and includes discontinuously supplying a source gas of the TiCN layer.

Specifically, first, $TiCl_4$, $CH_3CN$, $N_2$, and $H_2$ are used as the source gas. For example, mixing amounts are as follows: $TiCl_4$ is in an amount of 2 to 10 vol %, $CH_3CN$ is in an amount of 0.4 to 2.5 vol %, $N_2$ is in an amount of 15 vol %, and the remainder is $H_2$.

The temperature in the reaction chamber during reaction by CVD is preferably 800° C. to 850° C.

The pressure in the reaction chamber during reaction by CVD is preferably 6 kPa to 7 kPa and is more preferably 6 kPa to 6.7 kPa.

A total gas flow rate during reaction by CVD is preferably 80 L/min to 120 L/min and is more preferably 80 L/min to 100 L/min.

An example of the method of discontinuously supplying a source gas is alternately supplying a source gas and a $H_2$ gas (100 vol %) per predetermined period of time. More specifically, supply of the source gas is stopped every time the source gas has been supplied for 15 minutes, and the $H_2$ gas of an equal volume to that of the source gas is supplied for one minute. Consequently, TiCN is subjected to atomization, which makes it possible to form a TiCN layer that is more likely to change to have a (311) orientation by peening.

Any other layer such as an $Al_2O_3$ layer may be stacked after the formation of the TiCN layer.

<Peening Step>

In the peening step, the TiCN layer in the flank face is peened. "Peening" means a process of colliding (projecting) a host of small spherical bodies (media) of steel, nonferrous metal, or the like against the surface of a flank face or the like at high speed to change the properties of the surface such as orientation and compressive stress. In the present embodiment, peening of the flank face reduces the ratio of the (422) plane and increases the ratio of the (311) plane in the TiCN layer of the flank face. Consequently, the TiCN layer has improved toughness and has excellent chipping resistance. The media can be projected in any manner as long as the orientation of the TiCN layer changes, and may be projected directly onto the TiCN layer or projected onto any other layer (e.g., $Al_2O_3$ layer) provided on the TiCN layer. The media can be projected in any manner as long as it is projected onto region d2 of the flank face, and for example, the media may be projected onto the entire flank face.

The distance between the projection unit that projects the media and the surface of the flank face or the like (hereinbelow, also referred to as a "projection distance") is preferably 80 mm to 120 mm and is more preferably 80 mm 100 mm.

The pressure applied to the media in projection (hereinbelow, also referred to as a "projection pressure") is preferably 0.1 MPa to 0.5 MPa and is more preferably 0.1 MPa to 0.3 MPa.

The process time of peening is preferably 10 seconds to 60 seconds and is more preferably 10 seconds to 30 seconds.

Each of the conditions of the peening described above can be appropriately adjusted in accordance with the structure of the coating.

<Other Steps>

In the manufacturing method according to the present embodiment, an additional step may be performed appropriately in addition to the steps described above to such an extent that the effects of peening are not impaired.

The present embodiment preferably further includes an $Al_2O_3$ layer stacking step of stacking the $Al_2O_3$ layer on the TiCN layer after the TiCN layer covering step or the peening step. When an $Al_2O_3$ layer is stacked by CVD, for example, the layer can be stacked as follows. First, $AlCl_3$, HCl, $CO_2$, $H_2S$, and $H_2$ are used as a source gas. For example, the mixing amounts may be as follow: $AlCl_3$ is in an amount of 1.6 vol %, HCl is in an amount of 3.5 vol %, $CO_2$ is in an amount of 4.5 vol %, $H_2S$ is in an amount of 0.2 vol %, and the remainder is $H_2$.

The conditions of CVD at this time may be a temperature of 1000° C., a pressure of 6.7 kPa, and a gas flow rate (total gas amount) of 56.3 L/min.

When any other layer is formed as described above, this layer may be formed by a conventional method.

<Notes>

The above description includes embodiments noted below.

(Note 1)

A surface-coated cutting tool including a base material and a coating covering the base material, wherein the base material includes a rake face, a flank face, and a cutting edge portion connecting the rake face and the flank face to each other, the coating includes a TiCN layer, the TiCN layer has a (422) orientation in a region d1, the region d1 being a region in the rake face and being sandwiched between a ridge line and an imaginary line D1, the ridge line being an intersection between the rake face and the flank face, the imaginary line D1 being 500 μm apart from the ridge line, and the TiCN layer has a (311) orientation in a region d2, region d2 being a region in the flank face and being sandwiched between the ridge line and an imaginary line D2 which is 500 μm apart from the ridge line.

EXAMPLES

Although the present invention will now be described in detail with reference to examples, the present invention is not limited thereto.

In the present example, the total thickness of a coating, the thickness of a TiCN layer, and the thickness of an $Al_2O_3$ layer were measured by observing a cross-section of the coating which is parallel to the normal direction of the surface of the base material at a 1000-fold magnification using an optical microscope. Specifically, these thicknesses were obtained by measuring any three points in the cross section and then taking an average value of the measured thicknesses at the three points.

<<Manufacture of Surface-Coated Cutting Tool>>

<Preparation of Base Material>

First, as the base material preparation step, a base material K, a base material L, and a base material M which are to be covered with a coating were prepared. Specifically, raw material powder having a mixing composition (mass %) shown in Table 1 was mixed uniformly using a commercially available attritor, thereby obtaining a powder mixture.

Then, this powder mixture was compression-molded into a predetermined shape (CNMG120408NUX), and a resultant compact was put into a sintering furnace and sintered at 1300° C. to 1500° C. for one to two hours, thereby obtaining base material K, base material L, and base material M made of cemented carbide. "CNMG120408NUX" is the shape of an indexable insert for turning. Herein, the "remainder" in Table 1 represents that WC accounts for the rest of the mixing composition (mass %).

TABLE 1

|  |  | Mixing composition (mass %) | | | | |
| --- | --- | --- | --- | --- | --- | --- |
| Type |  | Co | $Cr_3C_2$ | NbC | TaC | WC |
| Base material | K | 7.0 | 0.4 | 3 | 2.0 | Remainder |
|  | L | 10.0 | 0.4 | 3 | 2.0 | Remainder |
|  | M | 12.0 | 0.4 | 3 | 2.0 | Remainder |

<Formation of Coating>

As the TiCN layer covering step, the surfaces (including a rake face and a flank face) of base material K, base material L, and base material M are covered with a TiCN layer with a thickness as shown in Table 4 by CVD using a gas having a composition shown in Table 2. In the column "Gas composition (vol %)" in Table 2, $H_2$ gas being "Remainder" means that the $H_2$ gas accounts for the rest of the reaction gas composition (vol %).

Herein, for formation conditions a, b, and c, the reaction was accelerated by stopping the source gas per 15 minutes and flowing $H_2$ (100 vol %) for one minute.

That is to say, for formation conditions a, b, and c, reaction was accelerated by discontinuously supplying the source gas of the TiCN layer.

TABLE 2

| | Reaction atmosphere | | | | | | |
| --- | --- | --- | --- | --- | --- | --- | --- |
| Formation conditions | Temperature in reaction chamber (° C.) | Pressure in reaction chamber (kPa) | Total gas flow rate (L/min.) | Gas composition (vol %) | | | |
| | | | | $TiCl_4$ | $CH_3CN$ | $N_2$ | $H_2$ |
| a | 850 | 6.7 | 100.0 | — | 10.00 | 2.50 | 15.00 | Remainder |
| b | 850 | 6.7 | 100.0 | — | 6.00 | 1.50 | 15.00 | Remainder |
| c | 850 | 6.7 | 100.0 | — | 2.00 | 0.40 | 15.00 | Remainder |
| d | 780 | 6.7 | 100.0 | — | 11.00 | 1.00 | 0.00 | Remainder |
| e | 900 | 6.7 | 100.0 | First 120 minutes | 1.20 | 0.20 | 30.00 | Remainder |
| | | | | Second half | 7.20 | 1.20 | 15.00 | Remainder |

Further, an $Al_2O_3$ layer was stacked with a thickness as shown in Table 4 on the TiCN layer by CVD after the TiCN layer covering step ($Al_2O_3$ layer stacking step). $AlCl_3$, HCl, $CO_2$, $H_2S$, and $H_2$ were used as the source gas at this time. The reaction conditions used were as follows.

Temperature in reaction chamber: 1000° C.
Pressure in reaction chamber: 6.7 kPa
Total gas flow rate: 56.3 L/min <Peening>

Further, as the peening step, the coating after coating in the flank face of the cutting tool was peened from the front surface side on the peening conditions shown in Table 3, thereby changing the orientation of the TiCN layer in the flank face. Peening was performed by projecting media onto the Al$_2$O$_3$ layer provided on the TiCN layer on the conditions that the pressure applied to the media in projection (hereinafter, also referred to as a "projection pressure") is 0.3 MPa, the distance between the projection portion that projects media and the surface of the rake face or the like (hereinafter, also referred to as a "projection distance") is 100 mm, and the processing time is 10 to 30 seconds.

TABLE 3

| Peening conditions | Projection distance (mm) | Projection pressure (MPa) | Processing time (seconds) |
|---|---|---|---|
| A | 100.0 | 0.3 | 30 |
| B | 100.0 | 0.3 | 20 |
| C | 100.0 | 0.3 | 10 |

Table 4 shows the structure of and manufacturing conditions of cutting tools of Sample Nos. 1 to 19 manufactured in the above procedure. The cutting tools of Sample Nos. 1 to 15 correspond to examples, and the cutting tools of Sample Nos. 16 to 19 correspond to comparative examples.

TABLE 4

| Sample No. | Base material | TiCN layer formation conditions | Peening conditions | TiCN layer (μm) | Alumina layer (μm) | Overall thickness of coating (μm) |
|---|---|---|---|---|---|---|
| 1 | L | a | A | 8.0 | 1.5 | 9.5 |
| 2 | L | a | B | 8.1 | 1.6 | 9.7 |
| 3 | L | a | C | 7.8 | 1.7 | 9.5 |
| 4 | L | b | A | 8.3 | 1.5 | 9.8 |
| 5 | L | b | B | 8.0 | 1.5 | 9.5 |
| 6 | L | b | C | 8.0 | 1.4 | 9.4 |
| 7 | L | c | A | 8.1 | 1.5 | 9.6 |
| 8 | L | c | B | 8.0 | 1.5 | 9.5 |
| 9 | L | c | C | 7.9 | 1.6 | 9.5 |
| 10 | K | a | A | 8.0 | 1.6 | 9.6 |
| 11 | M | a | A | 8.0 | 1.6 | 9.6 |
| 12 | L | a | A | 6.0 | 1.6 | 7.6 |
| 13 | L | a | A | 10.0 | 1.5 | 11.5 |
| 14 | L | a | A | 8.0 | 4.0 | 12.0 |
| 15 | L | a | A | 8.0 | 0.0 | 8.0 |
| 16 | L | a | n/a | 8.0 | 1.5 | 9.5 |
| 17 | L | a | n/a | 6.0 | 1.6 | 7.6 |
| 18 | L | d | n/a | 8.0 | 2.1 | 10.1 |
| 19 | L | e | n/a | 9.5 | 3.5 | 13.0 |

<<Evaluations of Characteristics of Cutting Tools>>

Figure 8:
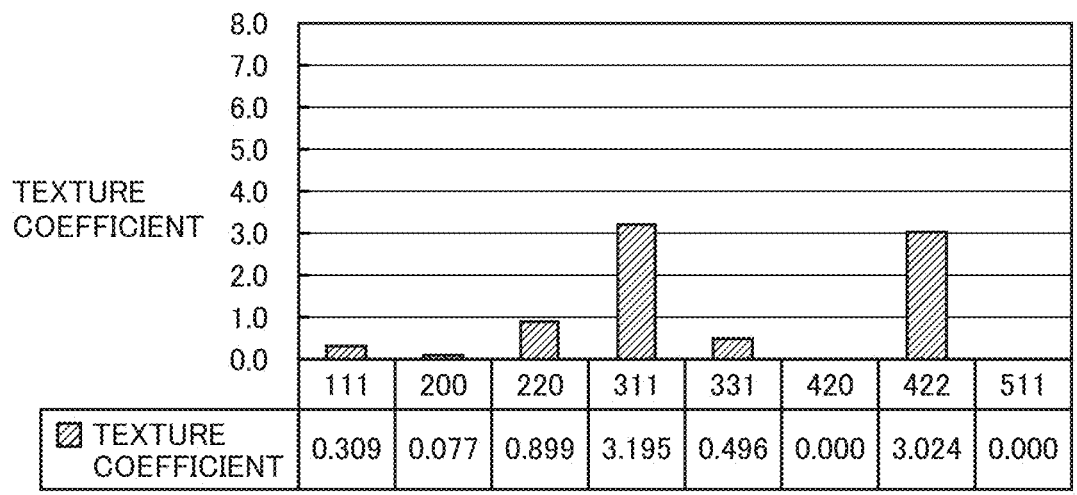
FIG. 8 is a graph showing a texture coefficient of each orientation plane in a region d2 of a flank face.
Figure 9:
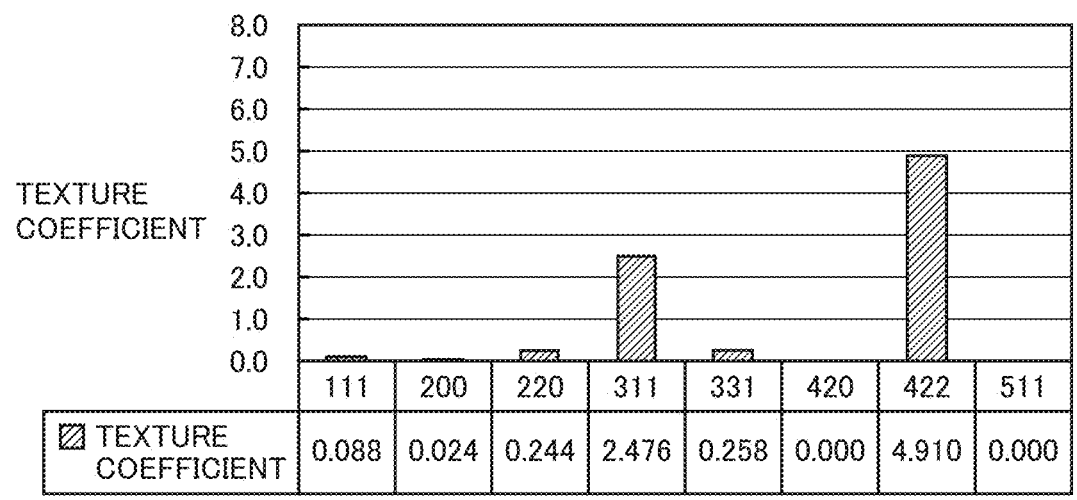
FIG. 9 is a graph showing a texture coefficient of each orientation plane in a region d1 of a rake face.

The texture coefficient of the orientation plane in each of the rake face and the flank face of the cutting tool was measured using the cutting tools of Sample Nos. 1 to 19 manufactured as described above. Measurement was performed on the following conditions. Measurement was performed by measuring three points of region d1 (or d2) (e.g., FIG. 7), and an average value thereof was calculated as the texture coefficient of each of region d1 of the rake face and region d2 of the flank face (FIG. 8, flank face; FIG. 9, rake face). Table 5 shows the results focusing on the (422) texture coefficient and the (311) texture coefficient.

(Conditions of X-ray Diffraction Measurement)
X-ray output 45 kV, 200 mA
X-ray source, wavelength CuKα, 1.541862 Å
Detector D/teX Ultra 250
Axis of scan 2θ/θ
Longitudinal limiting slit width 2.0 mm
Scan mode CONTINUOUS
Scan speed 20°/min

TABLE 5

| | TiCN layer | | Rake face | | Flank face | | TCflank (311)/ TCflank (422) | TCflank (422)/ TCrake (422) |
|---|---|---|---|---|---|---|---|---|
| Sample No. | formation conditions | Peening conditions | TCrake (422) | TCrake (311) | TCflank (422) | TCflank (311) | | |
| 1 | a | A | 4.9 | 2.5 | 3.0 | 4.5 | 1.50 | 0.61 |
| 2 | a | B | 5.0 | 2.7 | 3.5 | 4.1 | 1.17 | 0.70 |
| 3 | a | C | 4.8 | 2.5 | 3.3 | 3.5 | 1.06 | 0.69 |
| 4 | b | A | 4.6 | 2.5 | 2.7 | 4.5 | 1.67 | 0.59 |
| 5 | b | B | 4.5 | 2.6 | 3.7 | 4.2 | 1.14 | 0.82 |
| 6 | b | C | 4.5 | 2.6 | 3.6 | 3.8 | 1.06 | 0.80 |
| 7 | c | A | 4.0 | 2.4 | 2.5 | 4.3 | 1.72 | 0.63 |
| 8 | c | B | 4.2 | 2.4 | 3.3 | 3.8 | 1.15 | 0.79 |
| 9 | c | C | 4.0 | 2.5 | 3.4 | 3.6 | 1.06 | 0.85 |
| 10 | a | A | 4.9 | 2.5 | 3.0 | 4.0 | 1.33 | 0.61 |
| 11 | a | A | 4.9 | 2.5 | 3.0 | 3.9 | 1.30 | 0.61 |
| 12 | a | A | 4.7 | 2.5 | 3.0 | 3.6 | 1.20 | 0.64 |
| 13 | a | A | 4.9 | 2.5 | 3.0 | 3.7 | 1.23 | 0.61 |
| 14 | a | A | 4.9 | 2.5 | 3.6 | 3.8 | 1.06 | 0.73 |
| 15 | a | A | 4.9 | 2.5 | 3.0 | 4.5 | 1.50 | 0.61 |
| 16 | a | n/a | 4.7 | 2.5 | 4.9 | 2.5 | 0.51 | 1.04 |
| 17 | a | n/a | 4.9 | 2.5 | 4.7 | 2.5 | 0.53 | 0.96 |
| 18 | d | n/a | 3.1 | 2.0 | 3.1 | 2.0 | 0.65 | 1.00 |
| 19 | e | n/a | 1.2 | 3.0 | 1.5 | 3.0 | 2.00 | 1.25 |

The results of Table 5 confirmed that the orientation of the TiCN layer in the flank face changed from the (422) orientation to the (311) orientation by peening. In contrast, the orientation of the TiCN layer in the rake face which was not peened remained at the (422) orientation.

<<Cutting Test>>

Two types of cutting tests were performed using the cutting tools of Sample Nos. 1 to 19 manufactured as described above.

<Test 1: Chipping Resistance Test>

For the cutting tools of Sample Nos. 1 to 19, the cutting time until the cutting tool became chipped was measured on the following cutting conditions, and the chipping resistance of the cutting tool was evaluated. Table 6 shows the results of the evaluations. As a cutting time is longer, a cutting tool can be evaluated as having more excellent chipping resistance.

(Cutting Conditions of Chipping Resistance Test)
Workpiece material: SCM435 plate material
Peripheral speed: 250 m/min
Feed speed: 0.2 mm/rev
Cutting amount: 1.0 mm
Cutting fluid: present

TABLE 6

| Sample No. | Cutting time (minute) |
|---|---|
| 1 | 10 |
| 2 | 8 |
| 3 | 8 |
| 4 | 10 |
| 5 | 8 |
| 6 | 8 |
| 7 | 10 |
| 8 | 8 |
| 9 | 8 |
| 10 | 8 |
| 11 | 10 |
| 12 | 10 |
| 13 | 10 |
| 14 | 9 |
| 15 | 10 |
| 16 | 5 |
| 17 | 6 |
| 18 | 5 |
| 19 | 10 |

<Test 2: High-Speed Cutting Test of Outer Circumference of Round Bar>

For the cutting tools of Sample Nos. 1 to 19, the life of the tool was evaluated by measuring a cutting time until the flank face wear amount (Vb) reached 0.2 mm on the following cutting conditions and observing the final damaged condition of the cutting edge. Table 7 shows the results of the evaluations. It is known that there is a correlation between degrees of the flank face wear amount and the crater wear amount (rake face wear). As a cutting time is longer in the above test, thus, a cutting tool can be evaluated as having more excellent crater wear resistance and being more likely to have longer life even in high-speed cutting.

(Cutting Conditions of High-Speed Cutting Test of Outer Circumference of Round Bar)
Workpiece material: SCM435 round bar
Peripheral speed: 250 m/min
Feed speed: 0.15 mm/rev
Cutting amount: 1.0 mm
Cutting fluid: present

TABLE 7

| Sample No. | Cutting time (minute) | Final damaged condition |
|---|---|---|
| 1 | 40 | Worn |
| 2 | 41 | Worn |
| 3 | 40 | Worn |
| 4 | 38 | Worn |
| 5 | 38 | Worn |
| 6 | 39 | Worn |
| 7 | 37 | Worn |
| 8 | 37 | Worn |
| 9 | 37 | Worn |
| 10 | 38 | Worn |
| 11 | 36 | Worn |
| 12 | 40 | Worn |
| 13 | 40 | Worn |
| 14 | 42 | Worn |
| 15 | 39 | Worn |
| 16 | 40 | Worn |
| 17 | 20 | Worn |
| 18 | 35 | Worn |
| 19 | 20 | Worn |

The results of test 1 and test 2 revealed that the cutting tools (Sample Nos. 1 to 15) whose rake face has the (422) orientation and whose flank face has the (311) orientation have excellent chipping resistance and also have excellent crater wear resistance in high-speed machining.

The embodiments and examples of the present invention have been illustrated as described above, but it has been initially expected to appropriately combine configurations of the embodiments and examples.

It should be construed that the embodiments and examples disclosed herein have been presented for the purpose of illustration and non-restrictive in every respect. It is intended that the scope of the present invention is not limited to the above embodiments and examples but defined by the scope of the claims and encompasses all modifications equivalent in meaning and scope to the claims.

REFERENCE SIGNS LIST 1 base material, 1a rake face, 1b flank face, 1c cutting edge face, 10 cutting tool, AA boundary, AB ridge line, AB' imaginary ridge line, BB boundary, D1, D2 imaginary line, d1 region sandwiched between boundary AA and imaginary line D1 (or region sandwiched between ridge line AB and imaginary line D1), d2 region sandwiched between boundary BB and imaginary line D2 (region sandwiched between ridge line AB and imaginary line D2).

The invention claimed is:

1. A surface-coated cutting tool comprising:
a base material; and
a coating covering the base material, wherein
the base material includes a rake face and a flank face,
the coating includes a TiCN layer,
the TiCN layer has a (422) orientation in a region d1 in the rake face,
the TiCN layer has a (311) orientation in a region d2 in the flank face,
when the rake face and the flank face are continuous with each other with a cutting edge face therebetween,
the region d1 is a region sandwiched between an imaginary line D1 and a boundary between the rake face and the cutting edge face, the imaginary line D1 being 500 μm apart from an imaginary ridge line on the rake face, the imaginary ridge line being an intersection between a surface obtained by extending the rake face and a surface obtained by extending the flank face, and the region d2 is a region sandwiched between an imaginary line D2 and a boundary between the flank face and the cutting edge face, the imaginary line D2 being 500 μm apart from the imaginary ridge line on the flank face, and when the rake face and the flank face are continuous with each other with a ridge line therebetween,
the region d1 is a region sandwiched between the ridge line and an imaginary line D1 which is 500 μm apart from the ridge line on the rake face, and
the region d2 is a region sandwiched between the ridge line and an imaginary line D2 which is 500 μm apart from the ridge line on the flank face.

2. The surface-coated cutting tool according to claim 1, wherein
the TiCN layer having the (311) orientation means that, among texture coefficients TC (hkl) defined by equation (1) below, a texture coefficient TC (311) of a (311) plane in the TiCN layer is greater than a texture coefficient of any other crystal orientation plane, and
the TiCN layer having the (422) orientation means that, among the texture coefficients TC (hkl) defined by equation (1) below, a texture coefficient TC (422) of a (422) plane in the TiCN layer is greater than a texture coefficient of any other crystal orientation plane, $$TC(hkl) = \frac{I(hkl)}{I_0(hkl)} \left\{ \frac{1}{8} \sum_{x,y,z} \frac{I(h_x k_y l_z)}{I_0(h_x k_y l_z)} \right\}^{-1} \quad (1)$$

where
I(hkl) and I($h_x k_y l_z$) represent a measured diffraction intensity of a (hkl) plane and a measured diffraction intensity of a ($h_x k_y l_z$) plane, respectively,
$I_o$(hkl) and $I_o$($h_x k_y l_z$) represent an average value of powder diffraction intensities of TiC and TiN of a (hkl) plane according to a JCPDS database and an average value of powder diffraction intensities of TiC and TiN of a ($h_x k_y l_z$) plane according to the JCPDS database, respectively, and
(hkl) and ($h_x k_y l_z$) each represent any one of eight planes including a (111) plane, a (200) plane, a (220) plane, a (311) plane, a (331) plane, a (420) plane, a (422) plane, and a (511) plane.

3. The surface-coated cutting tool according to claim 2, wherein a ratio $TC_{flank}$ (311)/$TC_{flank}$ (422) of a (311) texture coefficient to a (422) texture coefficient in the region d2 of the flank face is greater than 1.

4. The surface-coated cutting tool according to claim 2, wherein a ratio $TC_{flank}$ (422)/$TC_{rake}$ (422) of a (422) texture coefficient in the region d2 of the flank face to a (422) texture coefficient in the region d1 of the rake face is not greater than 1.

5. The surface-coated cutting tool according to claim 1, wherein the TiCN layer has a thickness of not less than 6 μm and not greater than 10 μm.

6. The surface-coated cutting tool according to claim 1, wherein the base material includes one selected from the group consisting of cemented carbide, cermet, high-speed steel, ceramic, cBN sintered body, and diamond sintered body.

7. The surface-coated cutting tool according to claim 6, wherein when the base material is cemented carbide, the base material contains cobalt in an amount of not less than 7 mass % and not greater than 12 mass % relative to a total mass of the base material.

8. The surface-coated cutting tool according to claim 1, wherein the coating further includes an $Al_2O_3$ layer formed on the TiCN layer.

9. The surface-coated cutting tool according to claim 8, wherein the $Al_2O_3$ layer has a thickness of not less than 0.5 μm and not greater than 4 μm.

10. A method of manufacturing a surface-coated cutting tool according to claim 1, the method comprising:
a base material preparation step of preparing the base material;
a TiCN layer covering step of covering at least part of the rake face and at least part of the flank face with the TiCN layer; and
a peening step of peening the TiCN layer in the flank face,
wherein the TiCN layer covering step is performed by chemical vapor deposition and includes discontinuously supplying a source gas of the TiCN layer.

11. The method according to claim 10, wherein
the coating further includes an $Al_2O_3$ layer formed on the TiCN layer, and
the method further comprises an $Al_2O_3$ layer stacking step of stacking the $Al_2O_3$ layer on the TiCN layer after the TiCN layer covering step or the peening step.

* * * * *